(12) United States Patent
Okada et al.

(10) Patent No.: US 6,470,173 B1
(45) Date of Patent: Oct. 22, 2002

(54) FILTER UNIT COMPRISING A WIDEBAND BANDPASS FILTER AND ONE BAND-ELIMINATION FILTER

(75) Inventors: Takahiro Okada, Ishikawa-ken (JP); Jinsei Ishihara, Kanazawa (JP); Hideyuki Kato, Ishikawa-ken (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/409,835

(22) Filed: Sep. 30, 1999

(30) Foreign Application Priority Data

Sep. 30, 1998 (JP) ............................................. 10-276870

(51) Int. Cl.$^7$ ............................. G01V 3/00; H03H 7/00; H01P 1/20; H01P 3/08; H04B 1/46
(52) U.S. Cl. ...................... 455/82; 324/312; 333/174; 333/204; 333/205
(58) Field of Search ..................... 455/82; 324/312; 333/174, 204, 205

(56) References Cited

U.S. PATENT DOCUMENTS

| | | | | |
|---|---|---|---|---|
| 5,248,943 A | * | 9/1993 | Fox et al. ................... | 324/312 |
| 5,426,402 A | * | 6/1995 | Mariani ...................... | 333/205 |
| 5,541,558 A | * | 7/1996 | Weber et al. ............... | 333/174 |
| 5,825,263 A | * | 10/1998 | Falt ............................ | 333/204 |

* cited by examiner

Primary Examiner—William Cumming
(74) Attorney, Agent, or Firm—Ostrolenk, Faber, Gerb & Soffen, LLP

(57) ABSTRACT

A filter unit comprises a wideband bandpass filter; at least one band-elimination filter having a stop band within the passband of the bandpass filter, so that the passband is divided into a plurality of pass bands by the stop band; and the wideband bandpass filter and the band-elimination filter being disposed in a single dielectric member. Since the passband of a wideband bandpass filter is divided into a plurality of pass bands by stop bands of one or more band-elimination filters, signals having frequencies corresponding to these divided pass bands are able to pass through the filter unit simultaneously.

13 Claims, 7 Drawing Sheets

FILTER UNIT COMPRISING A WIDEBAND BANDPASS FILTER AND ONE BAND-ELIMINATION FILTER

BACKGROUND OF THE INVENTION

1. Field of the Invention

The present invention relates to a filter unit, duplexer, and communication apparatus for use in microwave frequency bands, for example.

2. Description of the Related Art

Up to now, filter units which allow two or more frequency bands to pass through at the same time have been composed of two or more bandpass filter units electrically connected in parallel. For example, in the case of a filter unit 91 allowing two frequency bands fa and fb to pass through simultaneously as shown in FIG. 13, a bandpass filter unit F21 allowing a frequency band fa to pass through and a bandpass filter unit F22 allowing a frequency band fb to pass through are electrically connected in parallel. FIG. 14 shows a filtering characteristic curve of the filter unit obtained in this way.

However, in the prior art filter unit, it is required to connect electrically in parallel the same number of bandpass filter units as the number of frequency bands to be allowed to pass through. Therefore, as the number of frequency bands to be allowed to pass through increases, the number of bandpass filter units connected in parallel increases. Because of this, the filter unit becomes large-sized and the soldering work for mounting the bandpass filter units, and so on, increases, and accordingly there is the problem that the manufacturing cost of the filter unit increases.

SUMMARY OF THE INVENTION

To overcome the above described problems, embodiments of the present invention provide a filter unit, a duplexer, and a communication apparatus which are small-sized and of low manufacturing cost.

One embodiment of the present invention provides a filter unit comprising: a wideband bandpass filter; at least one band-elimination filter having a stop band within the passband of the bandpass filter, the passband being divided into a plurality of pass bands by the stop band; and the wideband bandpass filter and the band-elimination filter being disposed in a single dielectric member.

In the above described filter, the bandpass filter and band-elimination filter may comprise at least one dielectric filter.

In the above described filter, the bandpass filter and band-elimination filter may comprise at least one strip line filter.

Another embodiment of the present invention provides a duplexer comprising at least one of above described filters.

Yet another embodiment of the present invention provides a communication apparatus comprising at least one of the above described filter or the above described duplexer.

According to the above described structure and arrangements, the passband of a bandpass filter is divided into a plurality of pass bands by the respective stop bands of one or more band-elimination filters. Thus, the signals having frequencies corresponding to these divided pass bands are able to pass through simultaneously.

Further, a duplexer and a communication apparatus according to the present invention are made small-sized because they are made up of a filter unit having the above characteristics.

Other features and advantages of the present invention will become apparent from the following description of embodiments of the invention which refers to the accompanying drawings.

DESCRIPTION OF EMBODIMENTS OF THE INVENTION

First Embodiment, FIGS. 1 through 6

Figure 1:
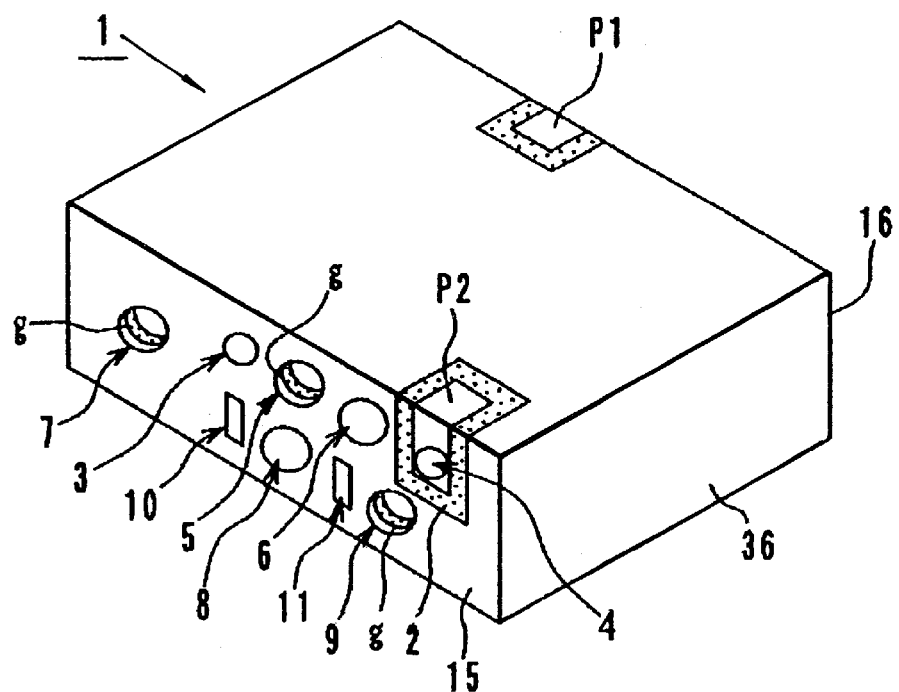
FIG. 1 is a perspective view showing a first embodiment of a filter unit according to the present invention.

Referring to FIG. 1, the filter unit 1 contains one wideband bandpass filter and three band-elimination filters. In a dielectric member (a dielectric block) 2 in the form of a rectangular solid with an outer conductor 36, input-output coupling resonator holes 3 and 4, resonator holes 5 through 9, and grounding holes 10 and 11 are provided.

Figure 2:
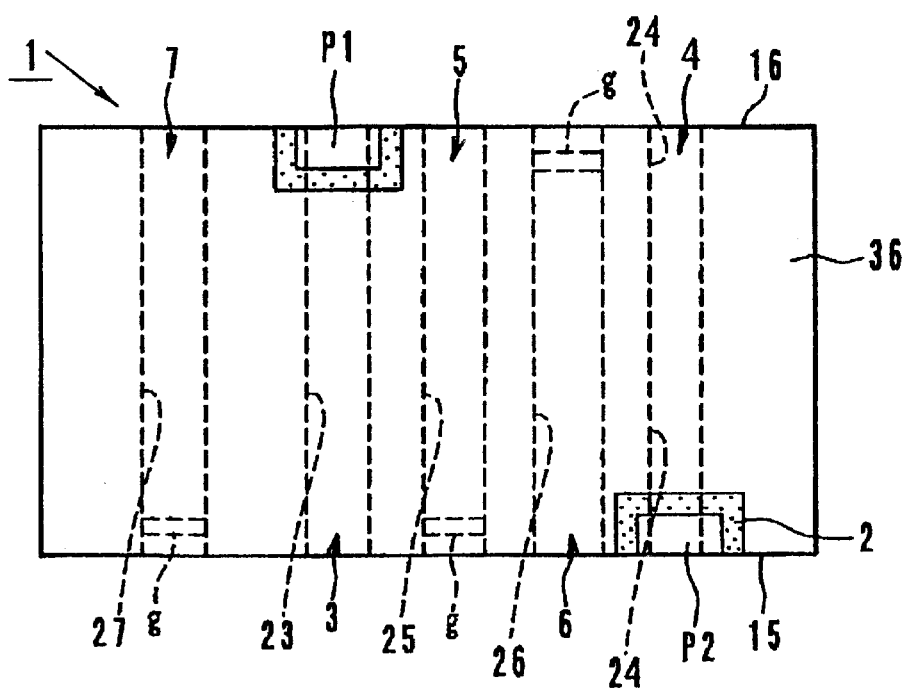
FIG. 2 is a plan view of the filter unit shown in FIG. 1.
Figure 3:
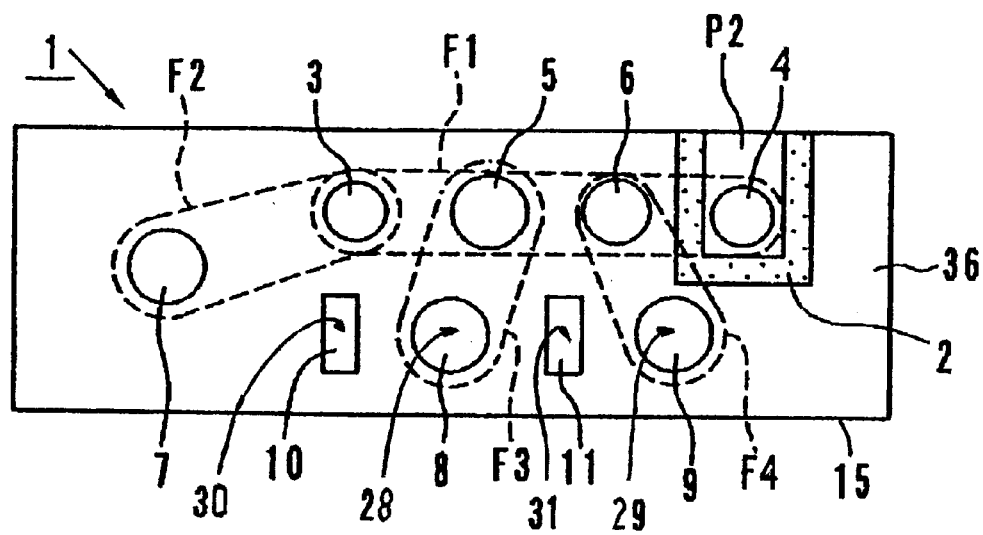
FIG. 3 is a front view of the filter unit shown in FIG. 1.

Each of the resonator holes 3 through 9 and grounding holes 10 and 11 pass from a first surface 15 of the dielectric block 2 completely through to a second surface 16 opposite to the first surface, as shown in FIG. 2. (The resonator holes 8 and 9, and grounding holes 10 and 11, are omitted from FIG. 2, but are shown in FIG. 3.) The resonator holes 3 through 9 and grounding holes 10 and 11 are straight holes each having a constant internal diameter, and on their internal wall surfaces inner conductors 23 through 29, and 30 and 31 are formed, respectively. (Inner conductors 28–31 are shown schematically in FIG. 3.) In the inner conductors 25, 27, and 29 of the resonator holes 5, 7, and 9, nonconductive portions (gaps) indicated by g are formed in the vicinity of the first surface 15, whereby the portions of the resonator holes 5, 7 and 9 which are electrically separated from the outer conductor 36 by the gaps are made open-circuit ends thereof. In like manner, in the inner conductors 26 and 28 of the resonator holes 6 and 8, nonconductive portions indicated by g are formed in the vicinity of the second surface 16, whereby the corresponding ends of the resonator holes 6 and 8 are made open-circuit ends thereof. On the other hand, the end of each inner conductor which is opposite to the open-circuit end, that is, the portion that is electrically connected to the outer conductor 36, is made the short-circuited end of the corresponding inner conductor.

On the outer surface of the dielectric block 2, the input-output terminals P1 and P2 are connected to the inner conductors 23 and 24 of the input-output coupling resonator holes 3 and 4, respectively, and the outer conductor 36 is disposed on substantially the entire surface of the dielectric block 2 except in the vicinity of these input-output terminals P1 and P2. The outer conductor 36 is grounded.

In the filter unit 1 constructed as explained above, the inner conductors 23 and 25 are interdigitally coupled (electromagnetically coupled) by inversely arranging the open-circuited and short-circuited ends of the inner conductors 23 and 25 disposed in the resonator holes 3 and 5, respectively. In like manner, the inner conductors 25 and 26 disposed in the resonator holes 5 and 6, respectively, are interdigitally coupled, and the inner conductors 26 and 24 disposed in the resonator holes 6 and 4, respectively, are also interdigitally coupled. In this way, the resonator holes 3, 4, 5, and 6 constitute one wideband bandpass filter F1 as shown in FIG. 3.

On the other hand, the respective pairs of inner conductors 23 and 27 disposed in the resonator holes 3 and 7, respectively, the inner conductors 25 and 28 disposed in the resonator holes 5 and 8, respectively, and the inner conductors 26 and 29 disposed in the resonator holes 6 and 9, respectively, are also interdigitally coupled. In this way, the resonator holes 3 and 7 constitute a band-elimination filter F2, the resonator holes 5 and 8 constitute a band-elimination filter F3, and the resonator holes 6 and 9 constitute a band-elimination filter F4.

Figure 4:
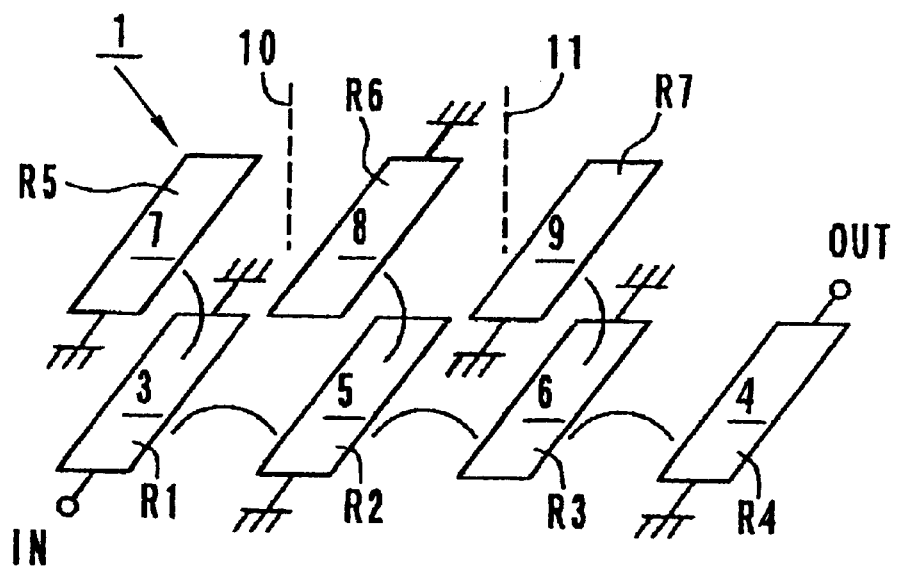
FIG. 4 is the electric equivalent circuit diagram of the filter unit shown in FIG. 1.

FIG. 4 shows the electric equivalent circuit diagram of the filter unit 1. The dielectric block 2 contains the dielectric resonators R1 through R7 composed of the resonator holes, respectively. The dielectric resonators R5 and R6 are shielded from each other by the inner conductor 30 of the grounding hole 10. In like manner, the dielectric resonators R6 and R7 are shielded from each other by the inner conductor 31 of the grounding hole 11.

Figure 5:
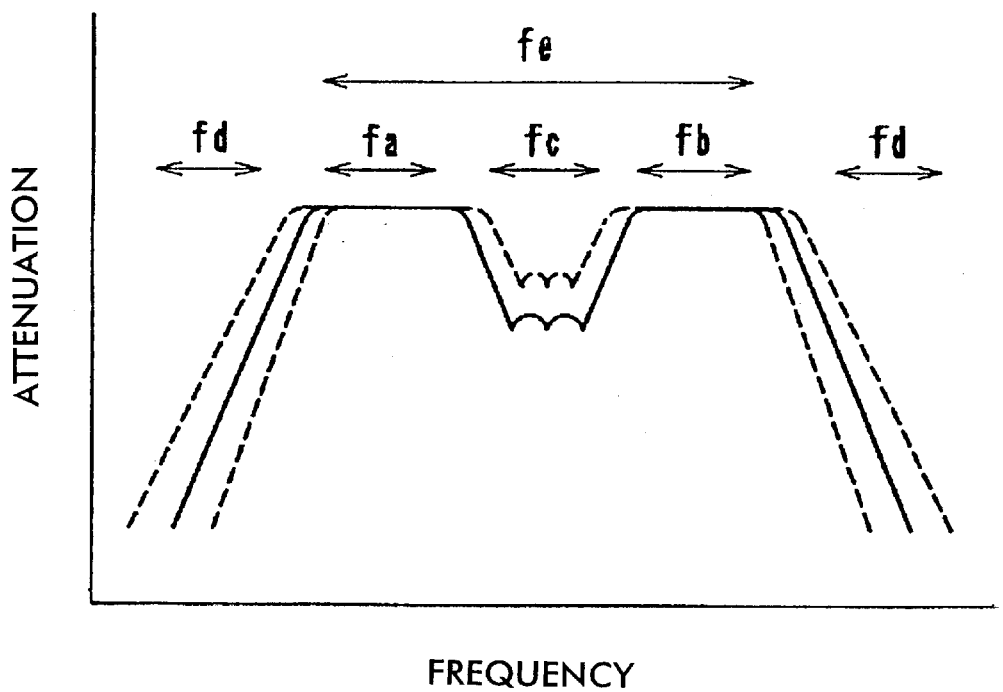
FIG. 5 is a filtering characteristic diagram of the filter unit shown in FIG. 1.

FIG. 5 shows the filtering characteristics of the filter unit 1. The stop band of each of the band-elimination filters F2 through F4 is located nearly in the middle of the passband fe of the wideband bandpass filter F1. Therefore, the passband fe is divided into two pass bands fa and fb by the stop band fc provided by the band-elimination filters F2 through F4. Signals having frequencies corresponding to these divided pass bands fa and fb can pass through the filter unit 1.

By altering the spacing between the resonator holes 3, 4, 5, and 6 of the wideband bandpass filter F1, altering the hole diameters, and so on, the filtering characteristic of the frequency band fd can be adjusted as shown by the dotted lines in FIG. 5. And by altering the spacing between the resonator holes 3 and 7 of the band-elimination filter F2 (as in the case of F3 and F4 as well), altering the hole diameters, and so on, the filtering characteristic of the stop band fc can also be adjusted as shown by the dotted lines in FIG. 5.

Figure 6:
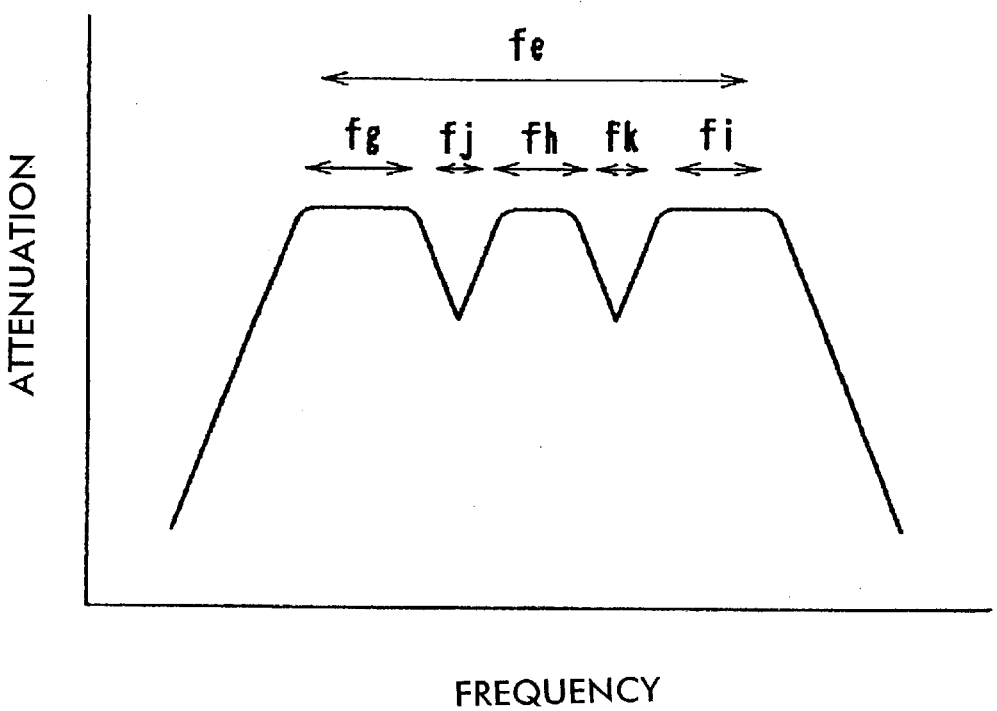
FIG. 6 is another filtering characteristic diagram of the filter unit shown in FIG. 1.

Further, by making the stop bands of the band-elimination filters F2 through F4 at frequencies which are separated from each other, the passband fe can be divided into three pass bands fg, fh, and fi by stop bands fj and fk as shown in FIG. 6.

Figure 7:
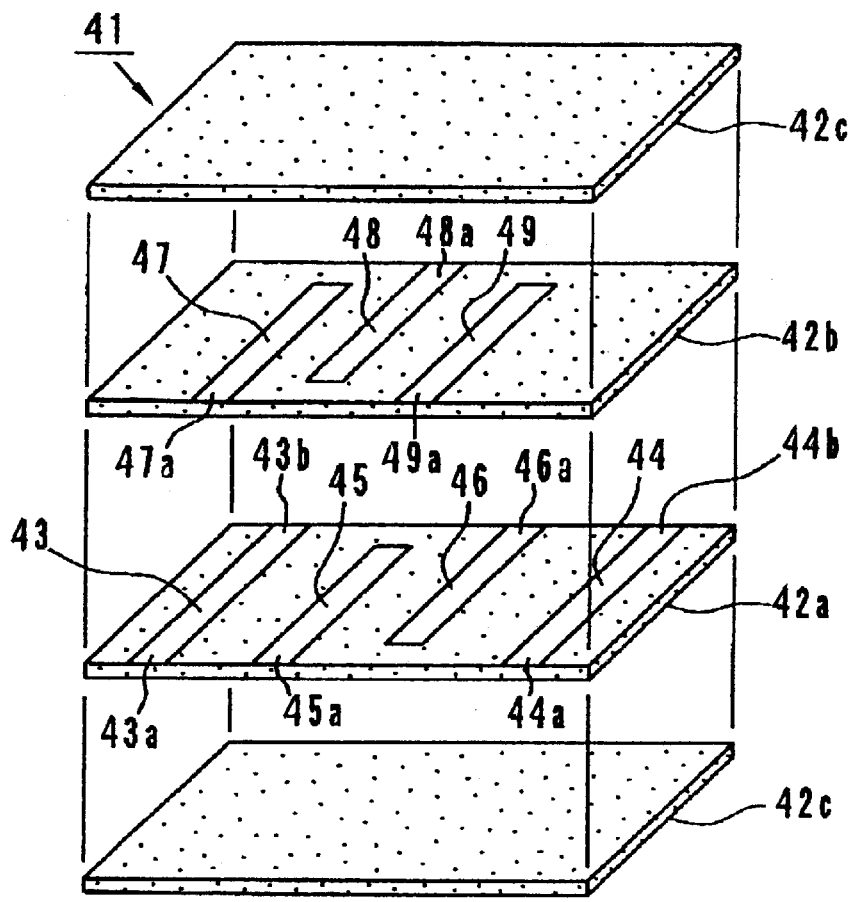
FIG. 7 is an exploded perspective view showing a second embodiment of a filter unit according to the present invention.
Figure 8:
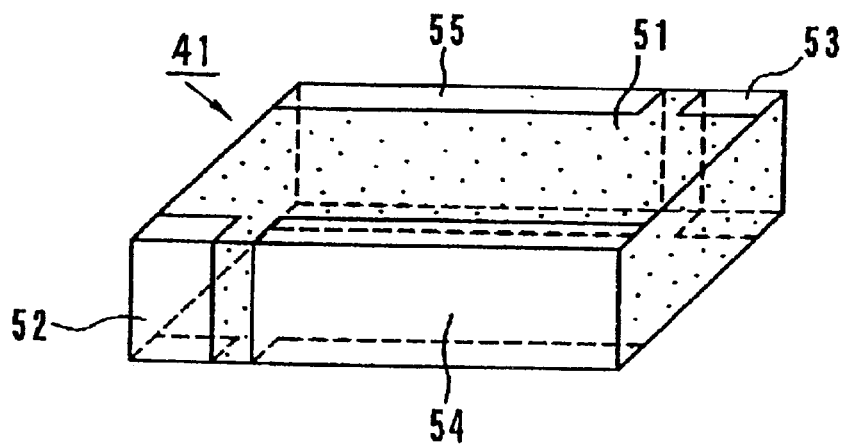
FIG. 8 is a perspective view of the filter unit shown in FIG. 7.

Second Embodiment, FIGS. 7 and 8

Another embodiment of a filter unit according to the present invention is shown in FIG. 7. The filter unit 41 is made up of a dielectric member (a dielectric sheet) 42a on the surface of which strip lines 43, 44, 45, and 46 are formed, and a dielectric member (a dielectric sheet) 42b on the surface of which strip lines 47, 48, and 49 are formed, and a pair of dielectric members (protective dielectric sheets) 42c, are disposed respectively on opposite sides of the dielectric members 42a and 42b.

In the strip lines 43 and 44, the end portions 43a and 44a are exposed at the front side of the sheet 42a and the end portions 43b and 44b are exposed at the back side of the sheet 42a. In the strip line 45, one end portion 45a is exposed at the front side of the sheet 42a. In the strip line 46, one end portion 46a is exposed at the back side of the sheet 42a. In the strip lines 47 and 49, end portions 47a and 49a are exposed at the front side of the sheet 42b. In the strip line 48, one end portion 48a is exposed at the back side of the sheet 42b.

After the sheets 42a through 42c have been stacked, they are integrally fired to form a laminated body 51. On front side surface of the laminated body 51 an external input-output electrode 52 and an external grounding electrode 54 are formed, and on the back side surface an external input-output electrode 53 and an external grounding electrode 55 are formed. To the external input-output electrode 52 the end portion 43a of the strip line 43 is electrically connected, and to the external input-output electrode 53 the end portion 44b of the strip line 44 is electrically connected. To the external grounding electrode 54, the end portions 44a, 45a, 47a, and 49a of the strip lines 44, 45, 47, and 49 are electrically connected, and to the external grounding electrode 55 the end portions 43a, 46a, and 48a of the strip lines 43, 46, and 48 are electrically connected.

Thus, the end portions 43b, 44a, 45a, 46a, 47a, 48a, and 49a of the strip lines 43 through 49 are connected to the grounding electrodes and are short-circuited to each other. On the other hand, the end portions of the strip lines which are opposite to the short-circuited ends are open-circuited. The strip lines 43 through 49 constitute strip line resonators, respectively. By arranging the open-circuited ends and short-circuited ends of the strip lines 43 and 45 in opposite directions, the strip lines 43 and 45 are interdigitally coupled. In the same way, the strip lines 45 and 46, and the strip lines 46 and 44 are interdigitally coupled. Because of this, the strip lines 43, 44, 45, and 46 constitute one wideband bandpass filter.

On the other hand, the respective pairs of strip lines 43 and 47, strip lines 45 and 48, and strip lines 46 and 49 are also interdigitally coupled. In this way, the strip lines 43 and 47, strip lines 45 and 48, and strip lines 46 and 49 constitute respective band-elimination filters.

The equivalent circuit of this filter unit 41 is nearly the same as the electric equivalent circuit shown in FIG. 4. Therefore, the filter unit 41 has the same effects as the filter unit 1 of the first embodiment.

Figure 9:
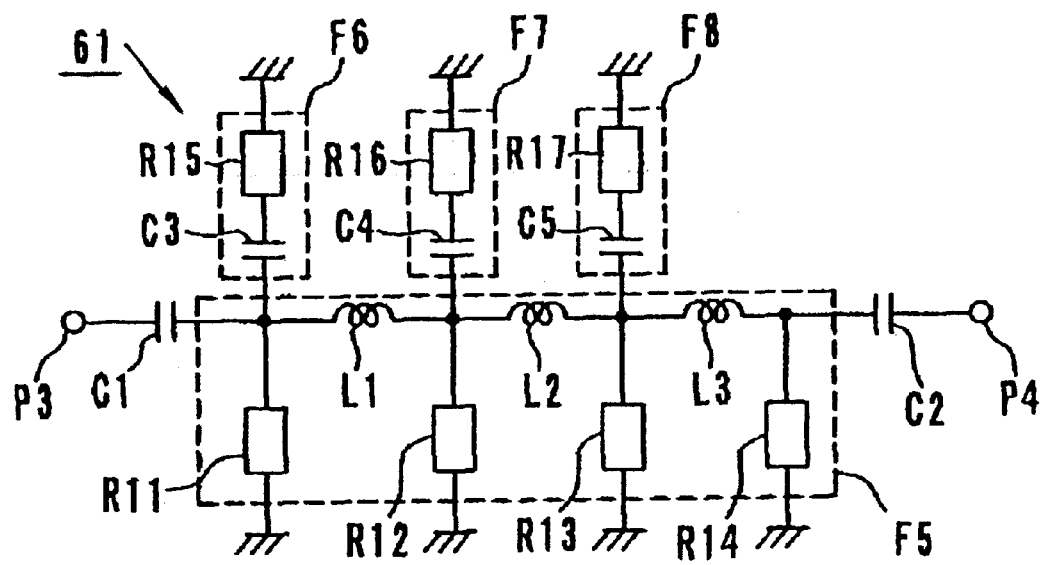
FIG. 9 is an electric equivalent circuit diagram showing a third embodiment of a filter unit according to the present invention.
Figure 10:
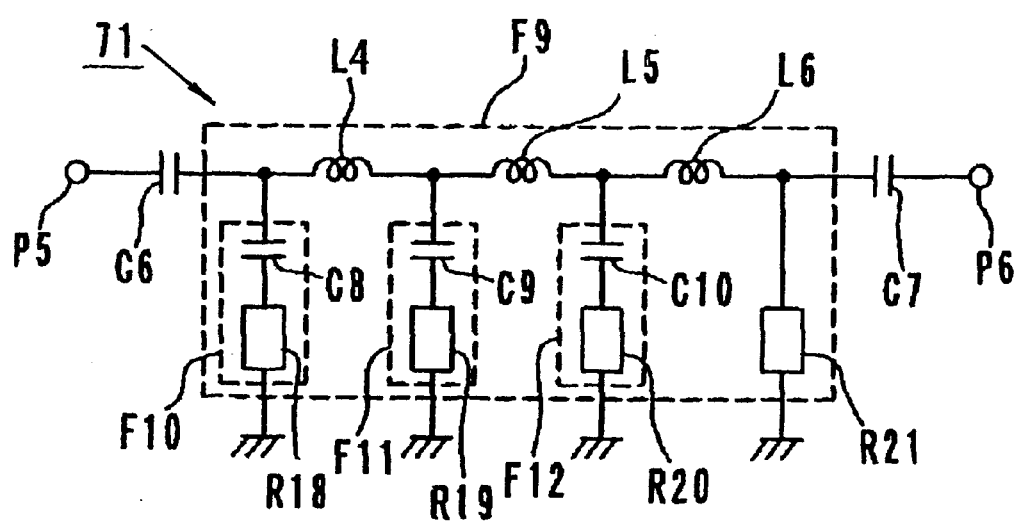
FIG. 10 is an electric equivalent circuit diagram showing a fourth embodiment of a filter unit according to the present invention.

Third and Fourth Embodiments, FIGS. 9 and 10

FIG. 9 shows the electric circuit diagram of a third embodiment of a filter unit according to the present invention. The filter unit 61 is made up of one wideband bandpass filter F5 and three band-elimination filters F6, F7, and F8.

The wideband bandpass filter F5 is realized by a four-stage coupling of resonators R11, R12, R13, and R14 through coupling coils L1, L2, and L3. This wideband bandpass filter F5 is electrically connected between input-output terminals P3 and P4 through coupling capacitors C1 and C2.

The band-elimination filter F6 is composed of a series resonance circuit of a resonance capacitor C3 and a resonator R15. In the same way, the band-elimination filter F7 is composed of a series resonance circuit of a resonance capacitor C4 and a resonator R16, and the band-elimination filter F8 is composed of a series resonance circuit of a resonance capacitor C5 and a resonator R17. The resonance capacitors C3 through C5 determine the extent of attenuation in the stop bands. The band-elimination filters F6, F7, and F8 are electrically connected in parallel with the resonators R11, R12, and R13 constituting the wideband bandpass filter F5, respectively. The resonators R11 through R17 may be dielectric resonators, strip line resonators, and so on.

FIG. 10 shows the electric circuit diagram of a fourth embodiment of a filter unit according to the present invention. The filter unit 71 is made up of one wideband bandpass filter F9 and three band-elimination filters F10, F11, and F12.

The band-elimination filter F10 is composed of a series resonance circuit of a resonance capacitor C8 and a resonator R18. In the same way, the band-elimination filter F11 is composed of a series resonance circuit of a resonance capacitor C9 and a resonator R19, and the band-elimination filter F12 is composed of a series resonance circuit of a resonance capacitor C10 and a resonator R20.

On the other hand, the wideband bandpass filter F9 is realized by a four-stage coupling of the band-elimination filters F10 through F12 and a resonator R21 through coupling coils L4, L5, and L6. This wideband bandpass filter F9 is electrically connected between input-output terminals P5 and P6 through coupling capacitors C6 and C7.

The above filter units 61 and 71 have the same effects as the filter unit 1 of the first embodiment.

Figure 11:
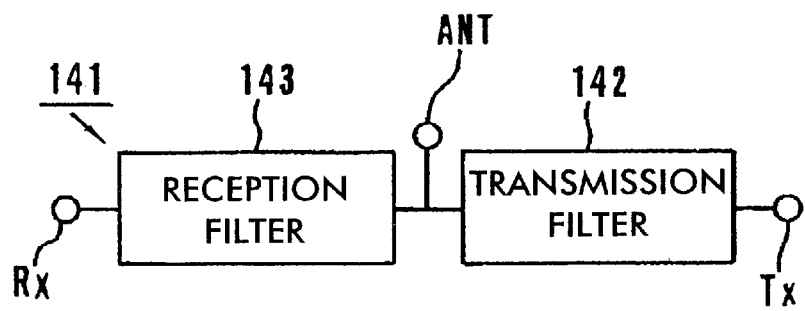
FIG. 11 is a block diagram showing one embodiment of a duplexer according to the present invention.

Fifth Embodiment, FIG. 11

A fifth embodiment is a duplexer (antenna-sharing unit) according to the present invention. As shown in FIG. 11, in the duplexer 141, a transmission filter 142 is electrically connected between a transmission terminal Tx and an antenna terminal ANT, and a reception filter 143 is electrically connected between a reception terminal Rx and the antenna terminal ANT. Here, as the transmission filter 142 and reception filter 143, the filter units 1, 41, 61, and 71 of the first through fourth embodiments can be used. By mounting these filter units 1, 41, 61, and 71 together, a small-sized and low-cost duplexer 141 can be realized.

Figure 12:
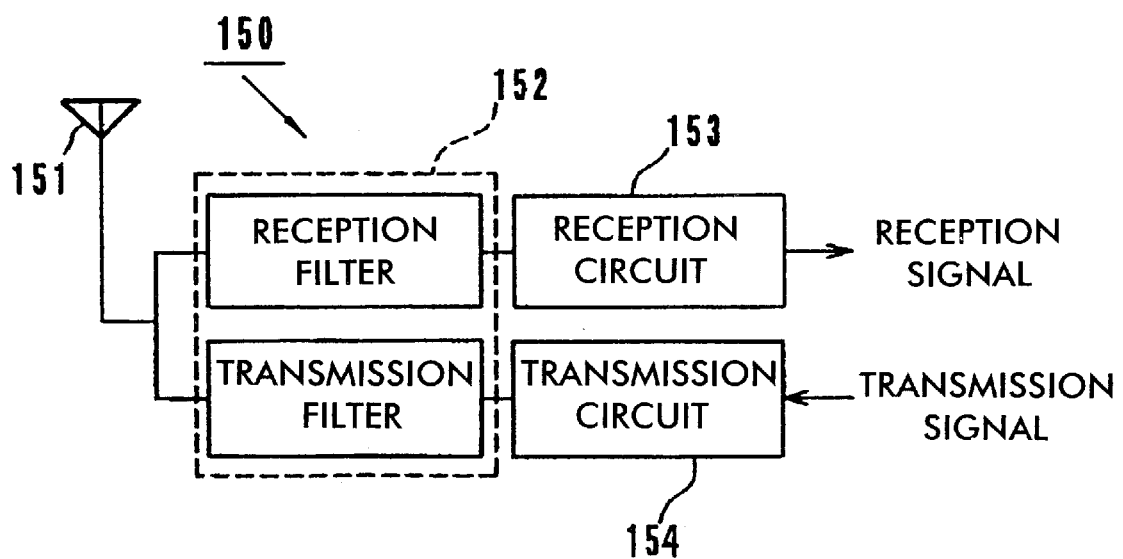
FIG. 12 is a block diagram showing one embodiment of a communication apparatus according to the present invention.
Figure 13:
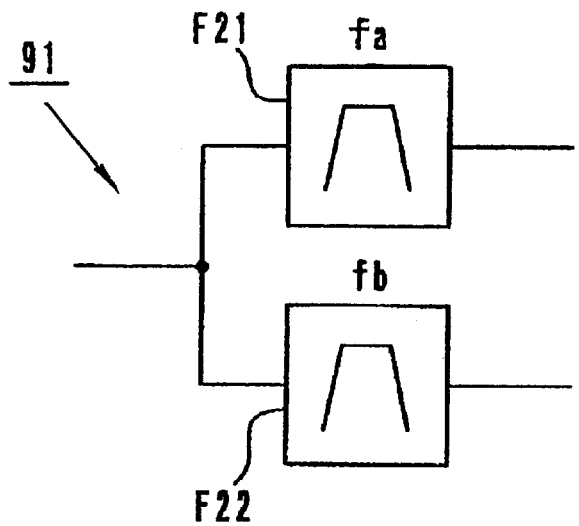
FIG. 13 is a block diagram showing a prior art filter unit.
Figure 14:
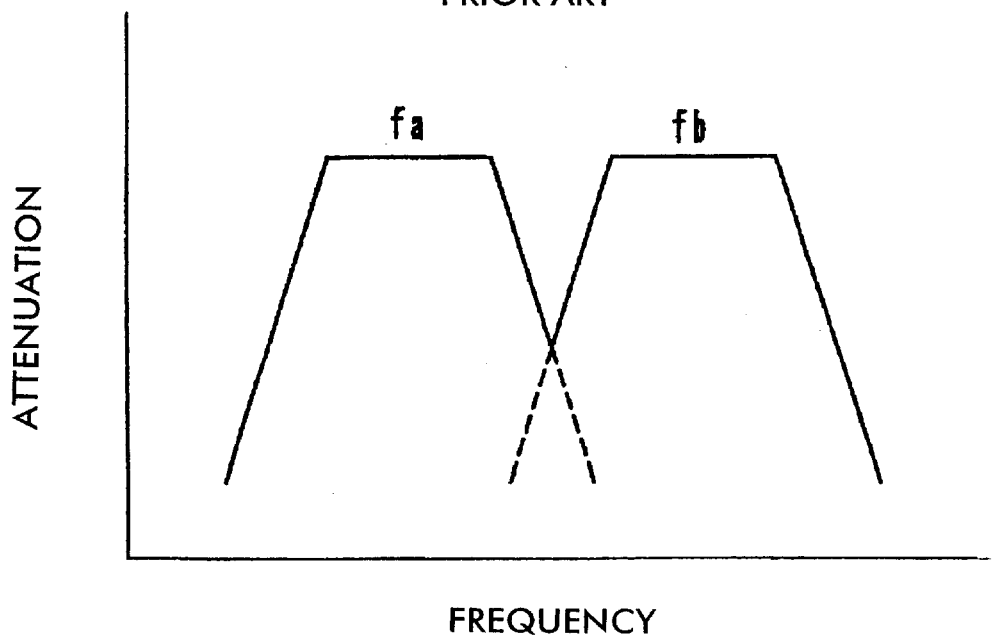
FIG. 14 a filtering characteristic diagram of the filter unit shown in FIG. 13.

Sixth Embodiment, FIG. 12

A sixth embodiment is a communication apparatus according to the present invention, a portable telephone being explained as an example. FIG. 12 is the electric circuit block diagram of the transmitter-receiver RF portion of a portable telephone 150. In FIG. 12, reference numeral 151 represents an antenna element, 152 an antenna-sharing unit, 153 a reception circuit, and 154 a transmission circuit. Here, as the antenna-sharing unit 152, the duplexer 141 of the fifth embodiment can be used.

Other Embodiments

A filter unit, a duplexer, and a communication apparatus according to the present invention are not limited to the above embodiments, and within the scope of the invention various modifications can be made.

For example, in the filter unit of the first embodiment, the resonator holes 5 through 9 may not be only straight holes, but one or more of these holes may also be stepped holes. In this way, a stepped portion is formed at the boundary between a large-diameter hole portion and a small-diameter hole portion, whereby the conductor path of an inner conductor which runs along this step portion is lengthened by the length of the step portion. Therefore, the length in the axial direction of the resonator holes of a filter unit can be made shorter.

As clearly understood in the above explanation, according to the present invention, the passband of a wideband bandpass filter can be divided into a plurality of pass bands by means of stop bands of band-elimination filters. Thus, a one-part filter that allows signals having frequencies corresponding to the divided pass bands, respectively, can be made without combining a plurality of parts, whereby a small-sized and low-cost filter unit can be obtained.

While the invention has been particularly shown and described with reference to embodiments thereof, it will be understood by those skilled in the art that the foregoing and other changes in form and details may be made therein without departing from the spirit of the invention.

What is claimed is:

1. A filter unit comprising:
   a wideband bandpass filter having a wide passband;
   at least one band-elimination filter having a stop band within the passband of the bandpass filter, the band-elimination filter being connected to said bandpass filter so that said wide passband is divided into a plurality of pass bands by the stop band; and
   the wideband bandpass filter and the band-elimination filter being disposed in a single dielectric member.

2. The filter unit according to claim 1, wherein the bandpass filter and band-elimination filter comprise a plurality of dielectric resonators disposed in said dielectric member.

3. The filter unit according to claim 1, herein the bandpass filter and band-elimination filter comprise a plurality of strip lines disposed in said dielectric member.

4. A duplexer comprising:
   a transmission terminal, a reception terminal, and an antenna terminal;
   a first filter unit connected between said transmission terminal and said antenna terminal; a second filter unit connected between said antenna terminal and said reception terminal;
   at least one of said first and second filter units comprising:
   a wideband bandpass filter having a wide passband;
   at least one band-elimination filter having a stop band within the passband of the bandpass filter, the band-elimination filter being connected to said bandpass filter so that said wide passband is divided into a plurality of pass bands by the stop band; and
   the wideband bandpass filter and the band-elimination filter being disposed in a single dielectric member.

5. A duplexer according to claim 4, wherein the bandpass filter and band-elimination filter comprise a plurality of dielectric resonators disposed in said dielectric member.

6. A duplexer according to claim 4, wherein the bandpass filter and band-elimination filter comprise a plurality of strip lines disposed in said dielectric member.

7. A communication apparatus comprising:

a transmission circuit;

a reception circuit;

a duplexer having a transmission terminal connected to said transmission circuit; a reception terminal connected to said reception circuit; and an antenna terminal;

a first filter unit being connected between said transmission terminal and said antenna terminal; a second filter unit being connected between said antenna terminal and said reception terminal;

least one of said first and second filter units comprising:
a wideband bandpass filter having a wide passband;
at least one band-elimination filter having a stop band within the passband of the bandpass filter, the band-elimination filter being connected to said bandpass filter so that said wide passband is divided into a plurality of pass bands by the stop band; and
the wideband bandpass filter and the band-elimination filter being disposed in a single dielectric member.

8. A communication apparatus according to claim 7, further comprising an antenna connected to said antenna terminal.

9. A communication apparatus according to claim 7, wherein the bandpass filter and band-elimination filter comprise a plurality of dielectric resonators disposed in said dielectric member.

10. A communication apparatus according to claim 7, wherein the bandpass filter and band-elimination filter comprise a plurality of strip lines disposed in said dielectric member.

11. A communication apparatus comprising:

a transmission circuit;

a reception circuit;

a filter unit connected to one of said transmission circuit and said reception circuit;

said filter unit comprising:
a wideband bandpass filter having a wide passband;
at least one band-elimination filter having a stop band within the passband of the bandpass filter, the band-elimination filter being connected to said bandpass filter so that said wide passband is divided into a plurality of pass bands by the stop band; and
the wideband bandpass filter and the band-elimination filter being disposed in a single dielectric member.

12. A communication apparatus according to claim 11, wherein the bandpass filter and band-elimination filter comprise a plurality of dielectric resonators disposed in said dielectric member.

13. A communication apparatus according to claim 11, wherein the bandpass filter and band-elimination filter comprise a plurality of strip lines disposed in said dielectric member.

* * * * *